United States Patent [19]
Wu

[11] Patent Number: 6,048,765
[45] Date of Patent: Apr. 11, 2000

[54] METHOD OF FORMING HIGH DENSITY BURIED BIT LINE FLASH EEPROM MEMORY CELL WITH A SHALLOW TRENCH FLOATING GATE

[75] Inventor: Shye-Lin Wu, Hsinchu, Taiwan

[73] Assignee: Texas Instruments - Acer Incorporated, Hsinchu, Taiwan

[21] Appl. No.: 09/089,897

[22] Filed: Jun. 3, 1998

[51] Int. Cl.[7] .................................................. H01L 21/336
[52] U.S. Cl. ........................ 438/257; 438/221; 438/222; 438/259; 438/262; 438/270; 438/296
[58] Field of Search .................................. 438/221, 222, 438/257, 259, 262, 26, 270, 280

[56] References Cited

U.S. PATENT DOCUMENTS

| | | |
|---|---|---|
| 4,981,812 | 1/1991 | Nishizaka . |
| 5,208,179 | 5/1993 | Okazawa . |
| 5,340,769 | 8/1994 | Miyamoto . |
| 5,744,847 | 4/1998 | Wen . |
| 5,834,358 | 11/1998 | Pan et al. . |
| 5,854,114 | 12/1998 | Li et al. . |
| 5,872,043 | 2/1999 | Chen . |
| 5,880,007 | 3/1999 | Varian et al. . |
| 5,888,881 | 3/1999 | Jeng et al. . |
| 5,963,818 | 10/1999 | Kao et al. . |
| 5,970,341 | 10/1999 | Lin et al. . |

OTHER PUBLICATIONS

Albert Bergemont et al., Low Voltage NVG™: A New High Performance 3 V/5 V Flash Technology for Portable Computing and Telecommunications Applications, IEEE Transactions on Electron Devices, vol. 43, No. 9, Sep. 1996, pp. 1510–1517.

R. Kazerounian et al., Alternate Metal Virtual Ground Eprom Array Implemented in a 0.8μm Process for Very High Density Applications, 1991 IEEE, pp. 311–314.

J.D. Bude et al., Secondary Electron Flash—a High Performance, Low Power Flash Technology for 0.35μm and Below, 1997 IEEE, pp. 279–282.

T.P. Ong et al., CVD $SiN_x$ Anti–reflective Coating for Sub–0.5μm Lithography, 1995 Symposium on VLSI Technology Digest of Technical Papers, Apr., 1995, pp. 73 and 74.

Paul–Henri Bricout et al., Short–Channel Effect Immunity and Current Capability of Sub–0.1–Micron MOSFET's Using a Recessed Channel, IEEE Transactions on Electron Devices, vol. 43, No. 8, pp. 1251–1255.

S.Y. Ueng et al., Superior Damage–Immunity of Thin Oxides Thermally Grown on Reactive–ion–Etched Silicon Surface in $N^2O$ Ambient, IEEE Transactions on Electron Devices, vol. 41, No. 5, May 1994, pp. 850 and 851.

T. Yoshitomi et al., Silicided Silicon–Sidewall Source and Drain ($S^4D$) Structure for High–Performance 75–nm Gate Length pMOSFETs, 1995 Symposium on VLSI Technology Digest of Technical Papers, Apr. 1995, p. 11.

*Primary Examiner*—John F. Niebling
*Assistant Examiner*—Jonathan Hack
*Attorney, Agent, or Firm*—Harness, Dickey & Pierce, P.L.C.

[57] ABSTRACT

A method of fabricating buried bit line flash EEROM with shallow trench floating gate for suppressing the short channel effect is disclosed. The method comprises following steps: Firstly, a pad oxide layer and a n+ (such as phosphorus) doped oxide layer is successively formed on the silicon substrate. Then, a nitride layer is deposited on all surfaces as an antireflection coating layer. After coating a patterned mask on the nitride layer to define a plurality of buried bit line regions, a dry etch is used to etch the unmask region till the silicon substrate is slightly recessed to form shallow trenches. Subsequently, the photoresist is stripped, and an oxidation process to grow an oxynitride layer on resultant surface and form buried bit line using dopants in the oxide layer as a diffusion source. After refilling a plurality of trenches with n+ doped silicon layer, a planarization process such as CMP is done to form a plain surface using the nitride layer as an etching stopped layer. A stacked ONO layer is then deposited as an interpoly dielectric layer; Finally, another n+ doped polysilicon layer is formed and patterned to be word lines.

19 Claims, 6 Drawing Sheets

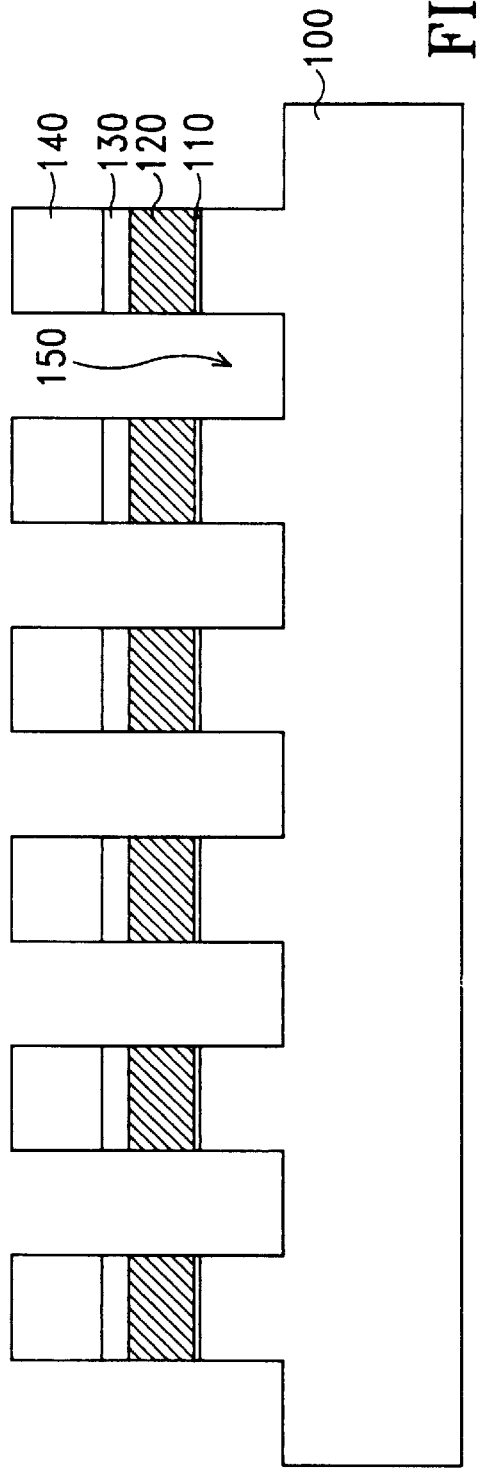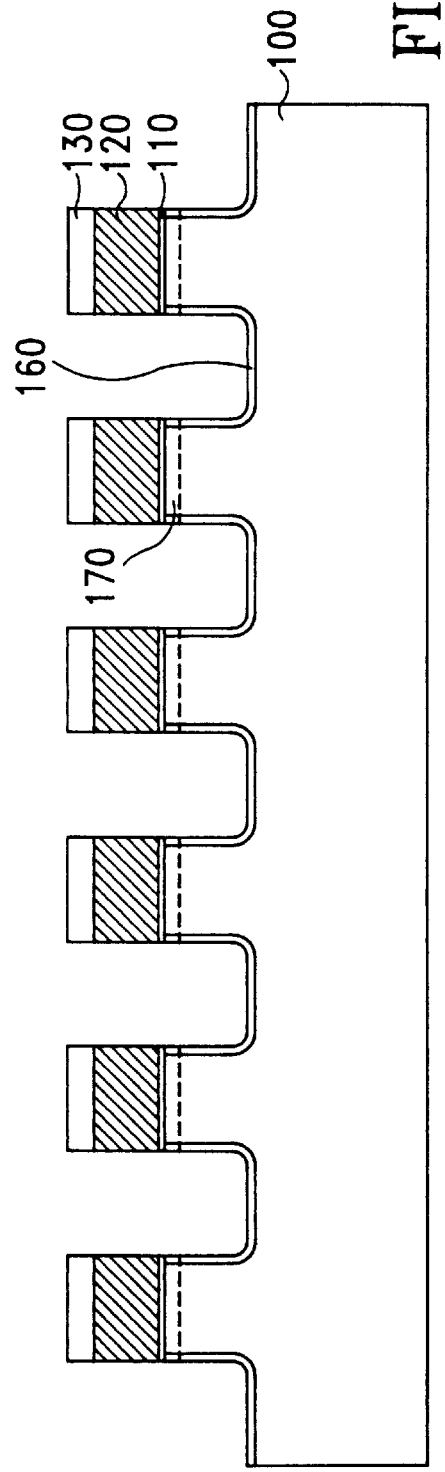

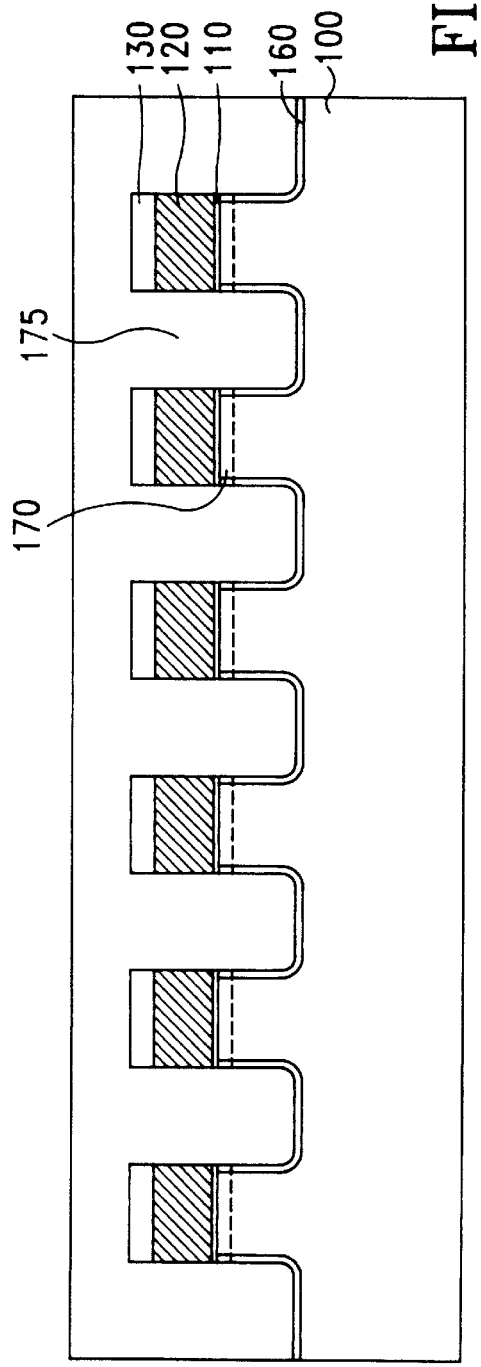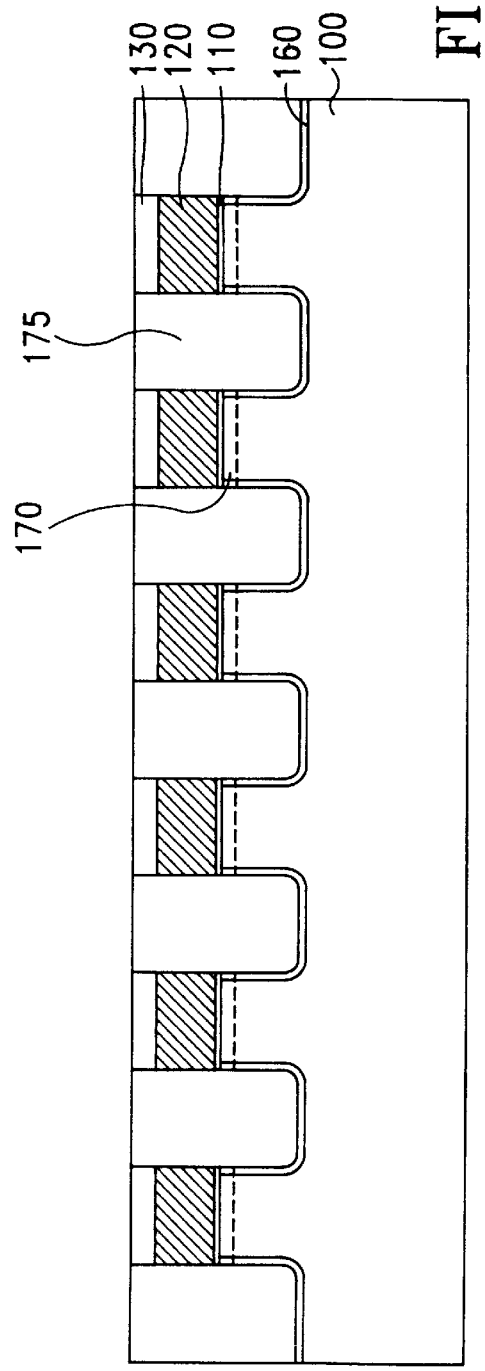

METHOD OF FORMING HIGH DENSITY BURIED BIT LINE FLASH EEPROM MEMORY CELL WITH A SHALLOW TRENCH FLOATING GATE

FIELD OF THE INVENTION

The present invention relates to a semiconductor memory process, and more specifically, to a method of fabricating high-density buried bit line flash EEPROM memory cell with a shallow trench-floating gate.

BACKGROUND OF THE INVENTION

In recent years, the development of the portable telecommunications and laptop computers has become a major driving force in the design and technology of semiconductor IC. This growing market requires low power, high-density and electrically re-writable nonvolatile memories. Electrically erasable programmable read only memories (EEPROM) which are electrically erased on a byte-by-byte basis is one choice, However, its cell size is too large for applications, and thus flash memory is another choice because of its small size and high reliability.

For achieving a high density memory device, Kazerounian et al., introduced a virtual ground concept using alternative metal virtual ground (AMG) to fabricate EPROM in the paper by "R. Kazerounian, et al.," Alternate Metal Virtual Ground EPROM Array Implemented in a 0.8 $\mu$m process for Very High Density Applications", IEDM Tech. Dig., p. 311, 1991. The synoptic layout and cross-sectional of this memory array are shown in FIGS. 1a–b, The front end of the process is a standard n-well CMOS process. After LOCOS field oxidation and EPROM gate a layer of the polysilicon 10 is deposited, an ONO dielectric layer 15 is then formed on the top of polysilicon 10. The ONO 15/poly-Si 10 is then patterned in elongated strips across each segment. Subsequently, a self-aligned arsenic implant form bit lines 20. An oxidation process combines with the CMOS gate oxidation process to form gate oxide and to grow a bit line oxide. The process continues with doped polysilicon 25 and tungsten silicide 35 deposition. A self-aligned stack gate etch process is employed to define word line 25 and floating gate cell 40. The advantage of this array are reduction of drain turn-on induced punch through and allow scaling of effective channel length to as low as 0.25 $\mu$m.

Later, the virtual ground concept was applied in the manufacture of low voltage NOR virtual ground power flash memories by Bergemontet, et al., with respect to a flash memory with a fast access time. "(A. Bergemont, et al.," Low voltage NVGTM: A New High Performance 3 V/5 V Flash Technology for portable Computing and Telecommunications Applications, "IEEE Trans. Electron Devices, ED-43, p. 1510, 1996.) The architecture of NVGTM is similar to AMG EPROM and with features that one metal bit-line shared between two columns of cells. These metal bit-lines are strapped to every other diffusion bit-line (stripped, continuous bit lines) through the selected transistors.

SUMMARY OF THE INVENTION

In the forgoing prior art there exist some problems, such as punch-through issue or narrow space between the adjacent bit lines and short channel effect. Thus in the present invention, a method of fabricating buried bit line flash EEROM using a recessed silicon trench floating gate for suppressing the short channel effect is disclosed. The method comprises the following steps: Firstly, an ultra-thin pad oxide layer about 2–20 nm in thickness and a n+ (such as phosphorus with concentrations of about $5 \times 10^{19} - 5 \times 10^{21}/cm^3$) doped oxide layer is successively formed on the silicon substrate. Then, a thin nitride layer of about 10–50 nm is deposited on all surfaces as an antireflection coating layer. After coating a patterned mask on the nitride layer to define a plurality of buried bit line regions, a dry etch is used to etch the unmask region till the silicon substrate is slightly recessed to form shallow trenches about 50–600 nm in depth. Subsequently, the photoresist is stripped, and an oxidation process at a temperature about 850–1150° C. to grow an oxynitride layer of about 3–25 nm in thickness on resultant surface and to form buried bit line using dopants in the oxide layer as a diffusion source. After refilling a plurality of trenches with n+ doped silicon layer, a planarization process such as CMP is done to form a plain surface using the nitride layer as an etching stopped layer. A stacked ONO layer of about 5–30 nm is then deposited as an interpoly dielectric layer; Finally another n+ doped polysilicon layer is formed and patterned to be word lines.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 4. is a cross-sectional view of patterning the nitride layer, the oxide layers and recessing the silicon substrate to define a plurality of floating region, in accordance with the present invention;

FIG. 5. is a cross-sectional view of performing an oxidation process to grow a thin oxynitride layer on the resultant surfaces and to form buried n+ bit line diffused from n+ doped oxide, in accordance with the present invention;

FIG. 6. is a cross-sectional view of refilling all trenches with n+ doped polysilicon or α-Si (FIG. 6a), and then performing planarization process by a CMP process (FIG. 6b), in accordance with the present invention;

DETAILED DESCRIPTION OF THE PREFERRED EMBODIMENT

A method of fabricating high density buried bit line flash EEROM with a floating gate in a trench of silicon substrate to prevent the short-channel effect is disclosed. The detailed processes are best illustrated by reference to the drawings, and are described as follows.

Figure 1A:
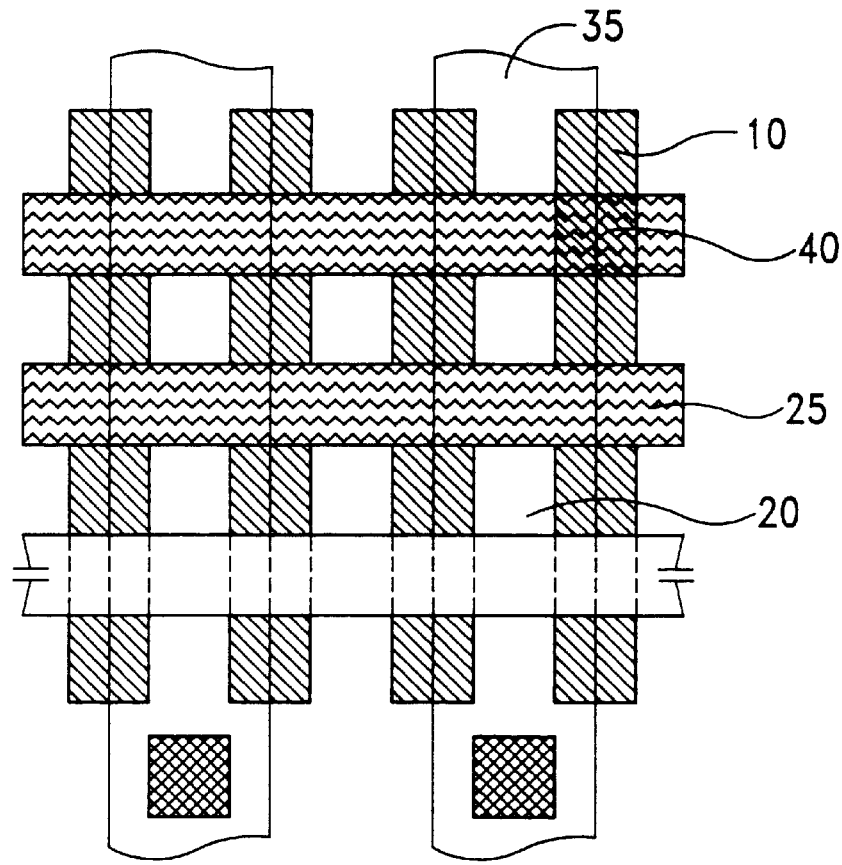
FIG. 1. is a synoptic layout of an EPROM array (FIG. 1a), and (FIG. 1b) is a cross-sectional view of an EPROM array, in accordance with the prior art.
Figure 1B:
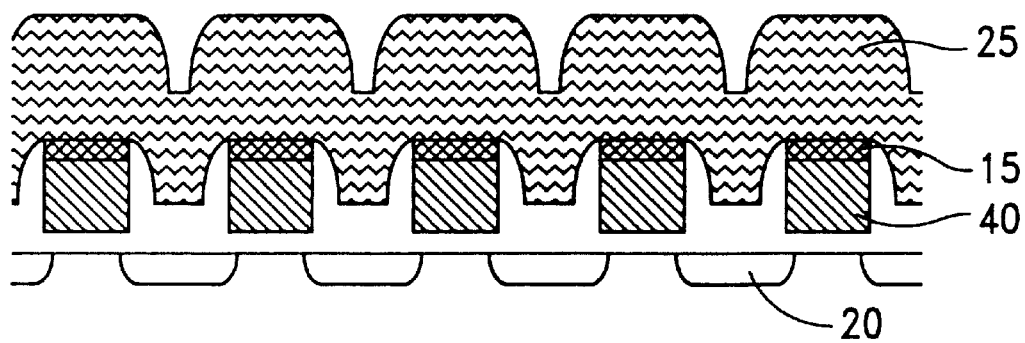
Figure 2:
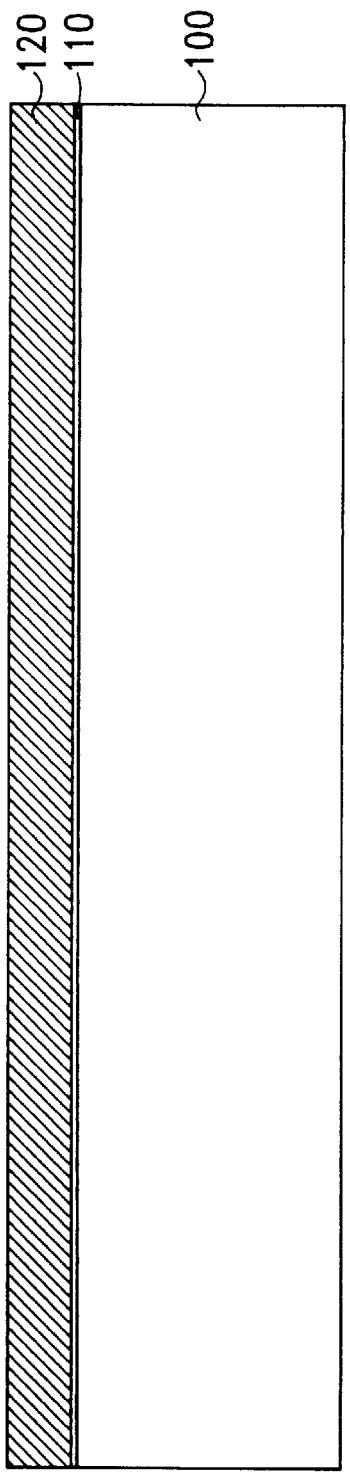
FIG. 2. is a cross-sectional view of forming a n+-doped oxide layer on the pad oxide layer, in accordance with the present invention.

Referring to FIG. 2, an ultra-thin pad oxide layer 110 is formed using a CVD method or thermal growing method on a silicon substrate 100. The pad oxide 110 thickness is about 2–20 nm. Then a high concentration in-situ n-type doped dielectric layer 120 is deposited on the pad oxide 110. In a preferred embodiment the dielectric layer 120 is a PSG layer (phosphosilicate glass) 120 deposited by applied APCVD (atmospheric pressure CVD) process at temperatures about 300–750° C. The doping concentration of phosphorus can be controlled by adjusting the $PH_3$ flow, in accordance with the equation:

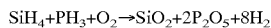

$$SiH_4 + PH_3 + O_2 \rightarrow SiO_2 + 2P_2O_5 + 8H_2$$

Preferably, the doping concentration is about $5 \times 10^9 - 5 \times 10^{21}/cm^3$, and the thickness of n+ oxide layer 120 is about 50–250 nm. The PSG layer 120 is deposited as an n-type diffusion source for forming buried bit line, and thus it is not necessary to perform a high temperature flowing process. On the other hand, the pad oxide 110 serves to insulate from contamination into the silicon substrate when the PSG is directed deposited on the silicon substrate 100.

Figure 3:
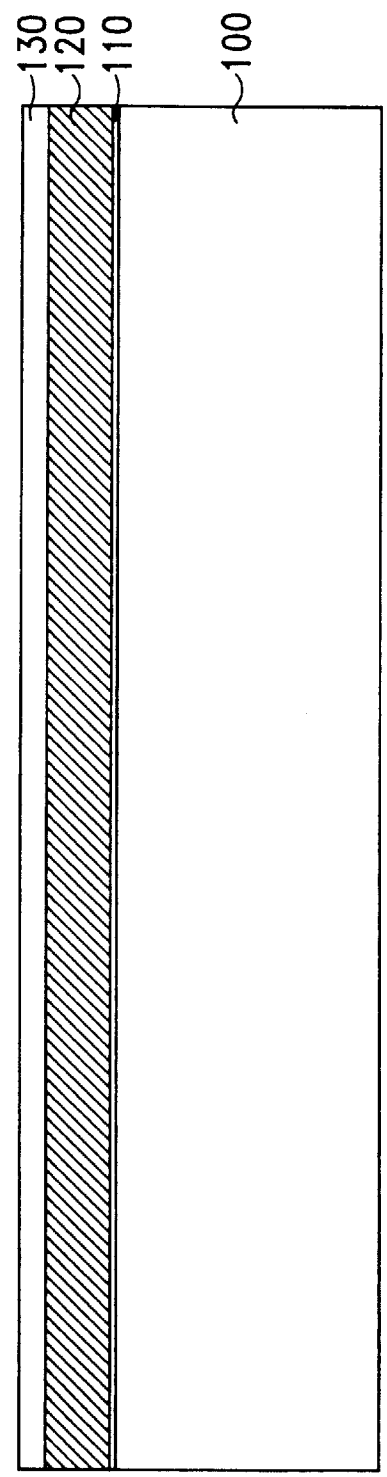
FIG. 3. is a cross-sectional view of a deposited nitride layer on the n+-doped oxide layer as an anti-reflection coating layer, in accordance with the present invention.

Referring to FIG. 3, an antireflection coating (ARC) layer such as a thin nitride layer 130 is then deposited on the n+ doped oxide layer 120 at a temperature of about 300–750° C. to a thickness about 10–50 nm. The low pressure CVD deposition $SiN_x$ layer on silicon layer for bottom antireflection coating has been found to be manufacturable for deep U-V and I-line lithography, as is reported by T. P. Ong, et al., in the reference, titled "CVD $SiN_x$ Anti-Reflection Coating For Sub-0.5 μm Lithography", Symp., on VLSI Tech. Dig., p. 73 1995.

As shown in FIG. 4, a patterned photoresist 140 is masked on the nitride layer 130 to define the floating gate area, and then etching steps are performed. A dry etching using $CHF_4$, $CH_3CHF_2$, $CCl_4$ and $C_3F_8$ as plasma source or reactive-ion-etching chemistries to remove successively the nitride layer 130, n+ oxide layer 120, pad oxide layer 110, and slightly recess the silicon substrate 100 to form a plurality of shallow trenches 150 for suppressing the short channel effect. Alternatively, using $CF_4/O_2$, $SF_6$, $CHF_3$ as an etchant to etching nitride layer 130 firstly, followed by use of bromine-based chemistries consisting of $CF_3Br$ and $HBr/NF_3$ to recess the silicon in an anisotropic way.

The recessed silicon trenches have a depth of about 50–600 nm. This was reported in the paper by P. H. Bricout, et al., titled "Short-Channel Effect Immunity and Current Capability of Sub-0.1-Micron MOSFET's Using a Recessed Channel", IEEE Trans. Electron Devices, ED-43, p. 1251, 1996. In the paper, a comparison of suppressing short channel effect between the planar MOSFET and the recessed channel MOSFET was investigated using both drift-diffusion and Monte Carlo simulation. The threshold voltage roll-off (threshold voltage roll-off increases the off current level and power dissipation) is clearly presented for the planar device, however, the recessed structure nearly keeps the same threshold voltage for all simulated channel lengths and for any gate oxide thickness. In addition, for a device shorter than 50 nm, only a slow increase of the threshold swing is obtained in the recessed MOSFET's device.

Referring to FIG. 5, a thermal oxidation process at a temperature of about 800–1150° C. in $N_2O$ or NO ambient is carried out to grow a thin oxynitride layer 160 to about 5–300 nm in thickness on the resultant silicon substrate. The ultra-thin oxynitride 160 can be used to recover the etching damage as reported in reference, by S. Y. Ueng, et al. titled, "Superior Damage-Immunity of Thin Oxides Thermally Grown on Reactive-Ion-Etched Silicon Surface in $N_2O$ Ambient", IEEE Trans. Electro Devices, ED-41, p. 850, 1994. The $N_2O$-grown oxides can remedy the RIE-induced defects, and exhibit significantly stronger immunity to RIE-induced damages. In addition, the MOS capacitor (MOSC) with oxynitride as a dielectric layer shows a great improvement over those of MOSC with pure oxygen ambient grown dielectric in the leakage currents and breakage fields. Further, the growth rate of the oxynitride 160 is slow, hence the thickness and conformity are well controlled. It is noted that during thermal oxidation, the dopants in the oxide layer 120 will be driven through the ultra-thin pad oxide layer 110 into the silicon substrate 100 to form the buried bit line 170.

Turning to FIG. 6a, an in-situ n-type doped polysilicon layer or an amorphous silicon (α-Si) layer 175 is deposited to refill the shallow trenches 150. To deposit the α-Si layer 175, the method such as a LPCVD or a PECVD can be used (operating at a temperature of about 400–550° C. or 250–400° C., respectively). However, to deposit the polysilicon layer 175, a higher temperature process (operate at temperatures of about 580–650° C.) such as a LPCVD is required. Which kind of silicon layer types being selected depends on the trench width (for an example, to refill the trench for 0.1–0.2 μm width, α-Si is prefer, but for 0.25 μm or above, the material can be poly-Si or α-Si). In a preferred embodiment, in-situ phosphorus doped or arsenic doped Si is preferred, and the concentration rises to about $5 \times 10^{19} - 5 \times 10^{21}/cm^3$. Thereafter, as shown in FIG. 6b a planarization process such as a chemical/mechanical polish (CMP) process using the nitride layer 120 as a CMP stopping layer is achieved to form a flat surface. The n+ doped polysilicon layer 175 serves as a floating gate of the flash memory.

Figure 7:
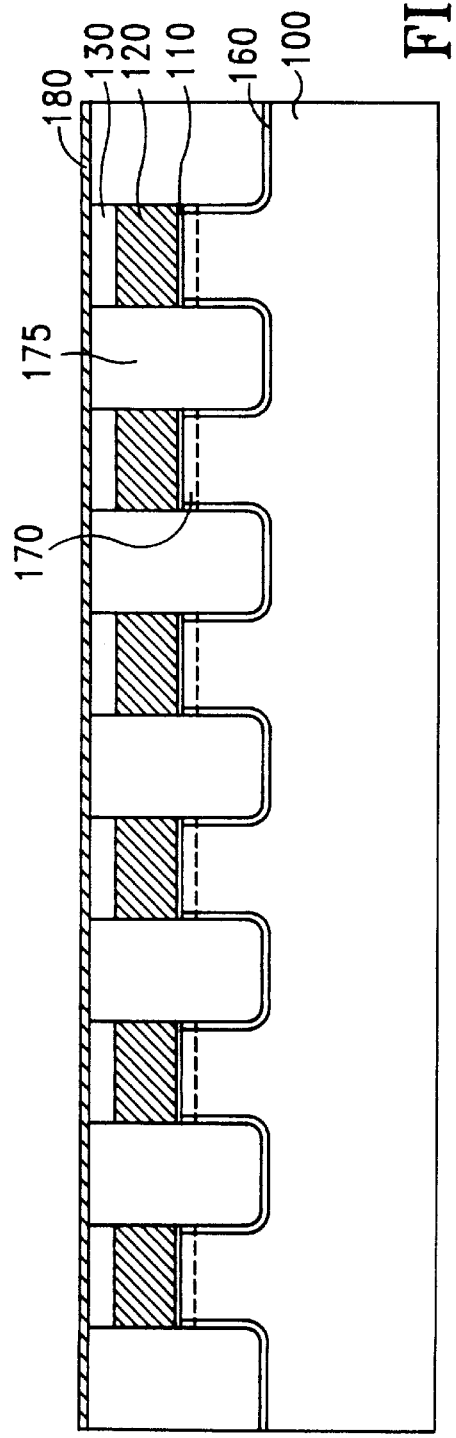
FIG. 7. is a cross-sectional view of forming a thin stacked ONO layer as an interpoly dielectric layer, in accordance with the present invention.

Referring to FIG. 7 after the CMP process, a thin stacked ONO 180 is formed as the interpoly dielectric 180. Preferably, the "ONO" layer refers the nitride layer formed using LPCVD on a thermal oxidation firstly, and then re-oxidation again to grow an oxide layer. The ONO layer having the properties of extremely dielectric integrity and long life time in breakdown characteristics. The thickness of upper oxide/nitride/ lower oxide of ONO 180 is, respectively, about 1–5 nm, 4–20 nm, and 1–5 nm.

Figure 8:
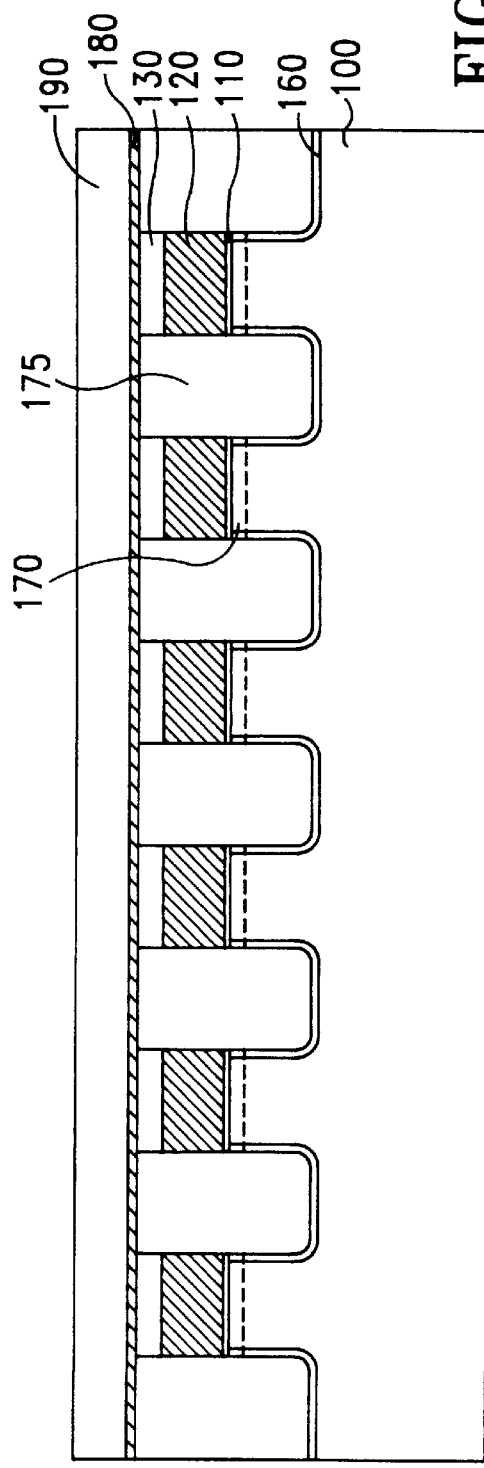
FIG. 8. is a cross-sectional view of depositing second n+ polysilicon as word lines, in accordance with present invention.

Referring next to FIG. 8, another n+ polysilicon layer 190 is deposited on all areas, and patterned to defined word lines. In a preferred embodiment, a CVD method, such as LPCVD is performed at a temperature of about 450–650° C., and the doping concentration rises to about $5 \times 10^{19} - 5 \times 10^{21}/cm^3$.

Figure 9:
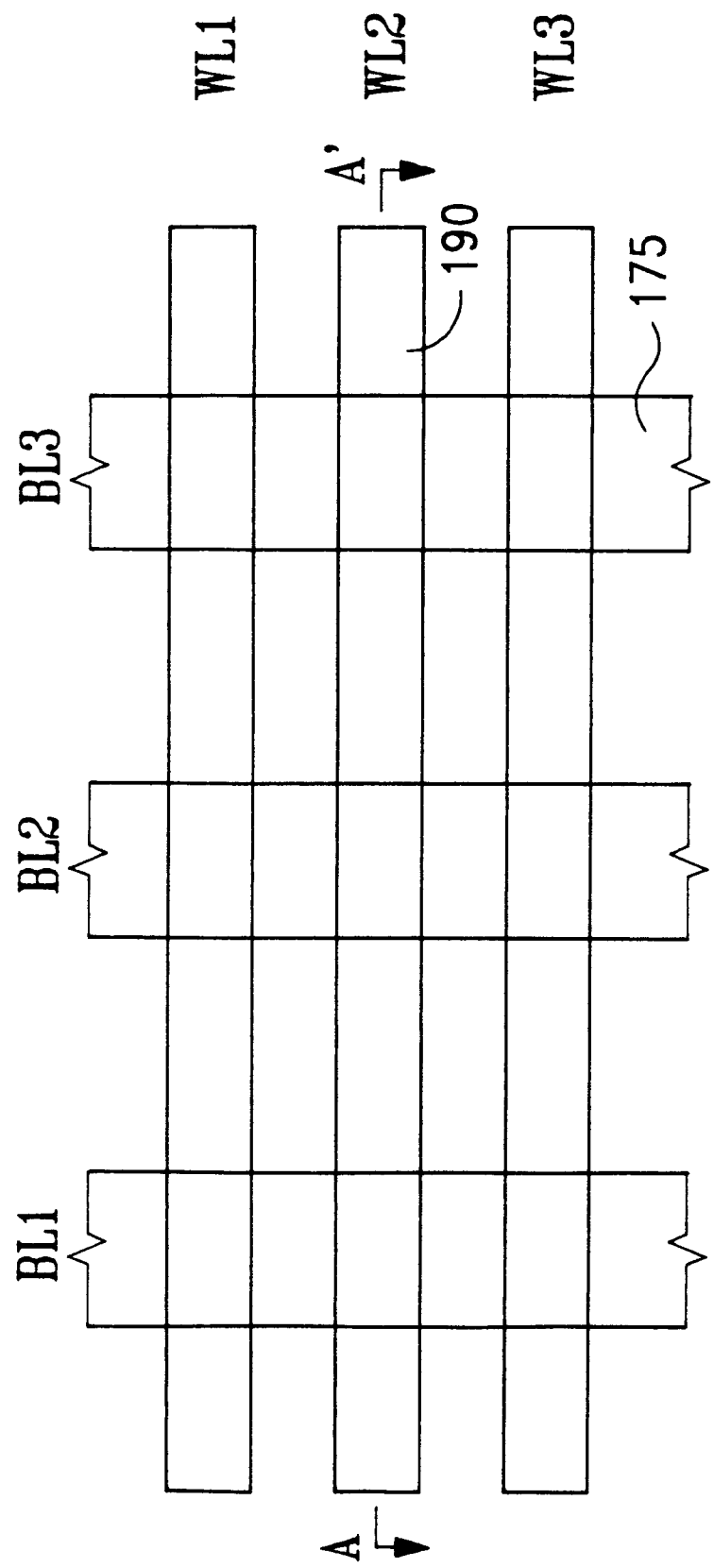
FIG. 9. is a top view of high density contactless flash memory with buried bit line and shallow trench floating gate, in accordance with the present invention.

FIG. 9 is a top-view diagram illustrating the high-density contactless nonvolatile memory with buried bit line and floating gate in the silicon trench region, wherein the source/drain regions are bit lines 170, and the polysilicon gate 190 are word lines. The view along the word line A–A' gives the cross-section of flash memories, as depicted in FIGS. 2–8.

In conclusion, the benefits of this invention are:
(1) High density and low power non-volatile memories can be achieved (due to cell structure with contactless array);
(2) the short channel effect can be suppressed due to the recessed silicon gate structure; and
(3) the punch through issue between two narrow adjacent bit lines can be minimized.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. A method of fabricating buried bit line flash EEPROM with a trench floating gate on a silicon substrate comprising the steps of:

forming a first dielectric layer on said silicon substrate;

forming a second dielectric layer with a first conductivity type dopant on said first dielectric layer;

forming an antireflection layer on said second dielectric layer;

coating a patterned mask on said antireflection layer to define a plurality of buried bit line regions;

forming a plurality trenches using said patterned mask as a mask;

removing said patterned mask;

performing an oxidation process to grow an oxynitride layer on said trenches and form buried bit line;

forming a silicon layer to refill said plurality of trenches;

performing a planarization process to said first silicon layer to form a plain surface using said antireflection layer as an etching stopping layer;

forming a stacked ONO layer as an interpoly dielectric layer; and forming a polysilicon layer on said stacked ONO layer to define word lines.

2. The method of claim 1 said first dielectric layer is a pad oxide with a thickness about 2–20 nm.

3. The method of claim 1, wherein said step of forming a second dielectric layer is performed by a CVD process at a temperature of about 300–750° C.

4. The method of claim 1, wherein said second dielectric layer is an oxide layers with a thickness of about 50–250 nm and contains phosphorus come up to concentrations of about $5 \times 10^{19} - 5 \times 10^{21}/cm^3$.

5. The method of claim 1, wherein said antireflection layer is a nitride layer and being deposited by a LPCVD method to a thickness of about 10–50 nm at a temperature about 600–800° C.

6. The method of claim 1, wherein said patterned mask is a patterned photoresist layer.

7. The method of claim 1, wherein said step of forming a plurality trenches comprises the steps of etching said antireflection layer, said second dielectric layer, and said first dielectric layer; and recessing said silicon substrate.

8. The method of claim 7, wherein said step of recessing said antireflection layer, said second dielectric layer, said first dielectric layer is performed by a dry etching method using a plasma source selected from the group consisting of $CF_4/O_2$, $SF_6$, $CHF_3$.

9. The method of claim 7, wherein said trench is about 50–600 nm in depth which is measured from the upper surface of said silicon substrate to the bottom of trench.

10. The method of claim 7, wherein said step of recessing said silicon substrate is carried out by a dry etching method using bromine-based chemistries consisting of $CF_3Br$ and $HBr/NF_3$.

11. The method of claim 1, wherein said oxynitride layer is formed to a thickness of about 5–30 nm at a temperature about 800–1150° C. in an ambient selected from the group consisting of $N_2O$, NO, and a combination thereof.

12. The method of claim 1, wherein said silicon layer comprises amorphous silicon and polysilicon layer, and contains n-type dopants to concentrations of about $5 \times 10^{19} - 5 \times 10^{21}/cm^3$.

13. The method of claim 1, wherein said step of performing thermal oxidation process is implemented at a temperature about 800–1150° C.

14. The method of claim 1, wherein said step of forming buried bit line is using said first conductivity type dopants containing second dielectric layer as the diffusion source.

15. The method of claim 1, wherein said steps of forming silicon layer is done at a temperature of about 450–650° C.

16. The method of claim 1, wherein said step of performing a planarization process is done by a method comprising a CMP process.

17. The method of claim 1, wherein said step of forming a stacked ONO layer as an interpoly dielectric layer is performed at temperatures of about 750–1100° C., said ONO with a second oxide layer over a nitride layer/first oxide layer to about 1–5 nm, 4–20 nm, and 1–5 nm, respectively.

18. The method of claim 1, wherein said step of forming polysilicon layer is performed by a LPCVD method at a temperature of about 450–650° C., and with n-type doping concentrations of about $5 \times 10^{19} - 5 \times 10^{21}/cm^3$.

19. The method of claim 12 and 18, wherein said n-type dopants is selected from the group consisting of arsenic containing dopants and phosphorus containing dopants.

* * * * *